(12) United States Patent
Bando

(10) Patent No.: US 9,283,690 B2
(45) Date of Patent: Mar. 15, 2016

(54) GLASS-PLATE WORKING METHOD AND GLASS-PLATE WORKING APPARATUS

(75) Inventor: Kazuaki Bando, Tokushima (JP)

(73) Assignee: BANDO KIKO CO., LTD., Tokushima (JP)

( * ) Notice: Subject to any disclaimer, the term of this patent is extended or adjusted under 35 U.S.C. 154(b) by 463 days.

(21) Appl. No.: 13/058,397

(22) PCT Filed: Jun. 3, 2009

(86) PCT No.: PCT/JP2009/002510
§ 371 (c)(1),
(2), (4) Date: Feb. 10, 2011

(87) PCT Pub. No.: WO2010/021071
PCT Pub. Date: Feb. 25, 2010

(65) Prior Publication Data
US 2011/0143639 A1    Jun. 16, 2011

(30) Foreign Application Priority Data

Aug. 22, 2008  (JP) ................................. 2008-214687

(51) Int. Cl.
*B24B 9/10*   (2006.01)
*H01L 21/677* (2006.01)
(Continued)

(52) U.S. Cl.
CPC ................. *B26F 3/00* (2013.01); *B24B 37/345* (2013.01); *B65G 49/064* (2013.01);
(Continued)

(58) Field of Classification Search
CPC .............. B24B 7/04; B24B 9/08; B24B 9/10; B24B 9/102; B24B 9/107; B24B 27/0069; B24B 37/34; B24B 37/345; H01L 21/677; H01L 21/67745; H01L 21/6776; H01L 21/683; C03B 33/03; B26F 3/00; B26F 3/002; B65G 47/91; B65G 49/06; B65G 49/061; B65G 49/064; B65G 49/066; B65G 2249/09

USPC .......................... 451/41, 44, 57, 70, 285, 336
See application file for complete search history.

(56) References Cited

U.S. PATENT DOCUMENTS 3,878,650 A * 4/1975 Klotzbach ..................... 451/239
4,685,180 A * 8/1987 Kitaya et al. ................... 29/33 R
(Continued)

FOREIGN PATENT DOCUMENTS

EP        0 493 069 A1    7/1992
FR        1390177         2/1965
(Continued)

OTHER PUBLICATIONS

International Search Report for PCT/JP2009/002510, mailed Jul. 21, 2009.
(Continued)

*Primary Examiner* — Eileen Morgan
(74) *Attorney, Agent, or Firm* — Nixon & Vanderhye P.C.

(57) ABSTRACT

A glass-plate working apparatus includes a glass-plate supporting portion 20*a* of a feed conveyor 7, a glass-plate supporting portion 20*b* of a cutting section 2, a glass-plate supporting portion 20*c* of a bend-breaking section 4, a glass-plate supporting portion 20*d* of a grinding section 3, and a glass-plate supporting portion 20*e* of a discharge conveyor 8; a cutting head 9, a bend-breaking device 66, and a grinding head 10 for processing glass plates 5 which are respectively supported by the supporting portions 20*b*, 20*c*, and 20*d*; and a transporting device 89 for transporting the glass plate 5 on the supporting portion 20*a* onto the supporting portion 20*b*, the glass plate 5 on the supporting portion 20*b* onto the supporting portion 20*c*, the glass plate 5 on the supporting portion 20*c* onto the supporting portion 20*d*, and the glass plate 5 on the supporting portion 20*d* onto the supporting portion 20*e*, respectively. The transporting device 89 is adapted to repeat reciprocating movement so as to sequentially transfer the glass plate 5 onto each of the supporting portions 20*a*, 20*b*, 20*c*, 20*d*, and 20*e* each time the processing operation by processing means is completed.

5 Claims, 13 Drawing Sheets

(51) Int. Cl.
  *C03B 33/03*  (2006.01)
  *B65G 47/91*  (2006.01)
  *B65G 49/06*  (2006.01)
  *B26F 3/00*  (2006.01)
  *B24B 37/34*  (2012.01)

(52) U.S. Cl.
  CPC ............ *B65G 49/066* (2013.01); *C03B 33/03* (2013.01); *H01L 21/677* (2013.01); *B65G 2249/04* (2013.01); *Y10T 83/0333* (2015.04); *Y10T 83/0341* (2015.04); *Y10T 225/12* (2015.04); *Y10T 225/307* (2015.04); *Y10T 225/321* (2015.04)

(56) References Cited

U.S. PATENT DOCUMENTS

| | | | |
|---|---|---|---|
| 5,079,876 A * | 1/1992 | Zumstein | 451/9 |
| 5,396,736 A * | 3/1995 | Bando | 451/5 |
| 6,461,223 B1 | 10/2002 | Bando | |
| 7,059,938 B2 * | 6/2006 | Bando | 451/12 |
| 2006/0128281 A1 * | 6/2006 | Bando | 451/70 |

FOREIGN PATENT DOCUMENTS

| | | |
|---|---|---|
| GB | 1 418 565 | 12/1975 |
| JP | 06-271062 | 9/1994 |
| JP | 6-286868 A | 10/1994 |
| JP | 09-263417 | 10/1997 |
| JP | 2000-079590 | 3/2000 |
| JP | 2001-002439 | 1/2001 |

OTHER PUBLICATIONS

Supplementary European Search Report for corresponding EP Application No. 09 80 8007 mailed Sep. 25, 2013, 3 pages.
Communication Pursuant to Article 94(3) EPC (Examination Report) mailed Jan. 30, 2015 in European Application No. 09 808 007.0 (7 pages).

* cited by examiner

GLASS-PLATE WORKING METHOD AND GLASS-PLATE WORKING APPARATUS

This application is the U.S. national phase of International Application No. PCT/JP2009/002510 filed 3 Jun. 2009, which designated the U.S. and claims priority to Japan Application No. 2008-214687 filed 22 Aug. 2008, the entire contents of each of which are hereby incorporated by reference.

TECHNICAL FIELD

The present invention relates to a method and an apparatus for working glass plates such as glass plates for window glass of automobiles and glass plates for liquid crystal displays.

The present invention concerns a method and an apparatus for working glass plates for manufacturing processed glass plates by subjecting glass plates to cutting process (formation of cut lines), bend-breaking operation, and peripheral edge grinding process.

The present invention relates to a method and an apparatus for working glass plates in which the processing of glass plates is finished while the glass plates are being sent sequentially to respective processing positions (e.g., positions of a cutting process section, a bend-breaking section, a peripheral edge grinding section, a transporting section, etc.).

In particular, the present invention concerns a glass-plate working method and a glass-plate working apparatus in which improvements are made on a glass-plate transporting method and a glass-plate transporting apparatus in which glass plates are sequentially transferred to glass-plate supporting portions at the respective processing positions. Hereinafter, in the description of the invention, the processing positions refer to those of a feed conveyor, a cutting section (a section where cut lines are formed on the glass surface by a cutter), a bend-breaking section, a grinding section, and a discharge conveyor. It should be noted that although the feed conveyor and the discharge conveyor do not perform the processing of the glass plates, they are assumed as forming processing positions. Also, as the glass-plate supporting portions, devices in their entirety on which the glass plates are placed and which support or hold these glass plates are called as such, and they refer to the feed conveyor, a cutting table, the top of the belt conveyor of the bend-breaking section, and a grinding table.

BACKGROUND ART

For example, in Patent Document 1, processing positions equipped with glass-plate supporting portions for supporting glass plates are arranged at intervals, and a glass-plate transporting device is provided for transferring the glass plates sequentially to the glass-plate supporting portions at the respective processing positions. The transporting device includes a moving base which reciprocates between positions above the glass-plate supporting portions at the respective processing positions and suction pads respectively mounted on this moving base in correspondence with the glass-plate supporting portion at each processing position by means of lifting devices each constituted by an air cylinder unit. The glass plates are adapted to be sequentially transported to the glass-plate supporting portions at the respective processing positions by the reciprocating movement of the moving base, the raising or lowering of the suction pads by the air cylinder units, and the suction or releasing operation of the glass plates by the suction pads. In particular, the air cylinder units are adapted to effect the raising and lowering of the suction pads by the on-off operation of compressed air, and hence the raising and lowering of the glass plate.

PRIOR ART DOCUMENT

Patent Document

Patent Document 1: JP-A-2002-68768

SUMMARY OF THE INVENTION

Problems that the Invention is to Solve

Incidentally, with the above-described glass-plate working apparatus, since the suction pads are arranged to be raised and lowered by the air cylinder units, it is impossible to control the raised or lowered position of the suction pads and the raising or lowering speed.

For this reason, in the delivery of the glass plate at the supporting base at each processing position, the suction pads must always be raised or lowered through the entire stroke of the air cylinder units. For this reason, it takes time to raise or lower the suction pads in the delivery of the glass plate.

Furthermore, the transport of the glass plate to a next processing position upon reception of the glass plate by the suction pads must be started after waiting for the completion of raising by the contraction over the entire stroke of the air cylinder units for lifting the suction pads, so that wasteful time is required.

Owing to the above and other reasons, it takes time to transport the glass plate from one processing position to another, so that it is impossible to expect speeding up in the manufacture of worked glass plates.

Accordingly, the present invention has been devised in the light of the drawbacks of the above-described conventional glass-plate working apparatus, and its object is to provide a glass-plate working method and a glass-plate working apparatus which make it possible to speed up the transport of the glass plate from one processing position to another and shorten takt time in the processing operation, thereby further increasing the production of worked glass plates.

Means for Solving the Problems

In accordance with the present invention, there is provided a glass-plate working apparatus in which processing positions equipped with glass-plate supporting portions for supporting glass plates are arranged at intervals, and which has a transporting device for transferring the glass plates each from the glass-plate supporting portion at one processing position to the glass-plate supporting portion at another processing position, the transporting device including a moving base which reciprocates between a position above the glass-plate supporting portion at one of the processing positions and a position above the glass-plate supporting portion at another one of the processing positions and suction pads respectively mounted on the moving base in correspondence with the glass-plate supporting portion at each of the processing positions by means of a lifting device, each of the glass plates being adapted to be transported from one of the processing positions to another one of the processing positions by the reciprocating movement of the moving base, the raising or lowering of the suction pad by the lifting device, and the suction or releasing of the glass plate by the suction pad, wherein the lifting device has a rack-and-pinion device consisting of a meshing combination of a rack and a pinion gear coupled to a servo motor, and the rack-and-pinion device on a side of a coupler coupling the servo motor and the pinion gear is mounted on the moving base while the suction pad is mounted on a side of the rack, or the rack-and-pinion device on the side of the rack is mounted on the moving base while the suction pad is mounted on the side of the coupler coupling the servo motor and the pinion gear, and wherein each of the suction pads is liftably held by a slide unit mounted on the moving base, and the lifting device causes the suction pad to undergo raising or lowering movement under numeral control by linear movement produced by the meshing between the rack and the pinion gear which rotates by being coupled to the servo motor.

With the glass-plate working apparatus in accordance with the present invention described above, the raising and lowering of the suction pad are effected by the rotation of the pinion gear coupled to the servo motor, high-speed linear movement through the meshing between the pinion gear and the rack, and positioning thereof.

Namely, since the raising and lowering of the suction pad is effected by the meshing between the pinion gear and the rack, response to the raising or lowering movement is fast, and the raising and lowering speed is fast. Furthermore, since the raising and lowering are subjected to numerical control, the suction pad can be raised or lowered speedily and accurately to a necessary position (heightwise position from a supporting surface line).

In addition, in the delivery of the glass plate through the raising and lowering of the suction pad, the heightwise position of the suction pad can be set (positioned) speedily and accurately to a necessary minimum heightwise position relative to the glass-plate supporting portion.

Accordingly, at the time of the delivery of the glass plate, it suffices if the suction pad is raised or lowered through a necessary minimum distance, and the raising or lowering speed is fast; therefore, the delivery time of the glass plate can be shortened substantially. In addition, since the raising/lowering distance of the suction pad can be reduced, and the raising and lowering response is fast and the speed is fast, it is possible to shorten the time period involved until the suction pad reaches a next processing position, is lowered, delivers the glass plate, and is raised again and until the raising is completed. For this reason, the time period until the start of return to the original position of the suction pad is shortened. Furthermore, the time period until the start of processing of the delivered glass plate can also be reduced, thereby making it possible to shorten the processing takt time.

From the advantages thus obtained, overall, it is possible to shorten the time period from the reception and delivery of the glass plate until the start of the processing operation from the delivery of the glass plate, as well as the time period until the start of return of the suction pad. Therefore, the production takt time of the glass plates and the production speed can be improved substantially.

In addition, since the raising and lowering of the suction pad is numerically controlled by the servo motor, as this servo motor for raising and lowering and a transport control motor for transporting movement are simultaneously controlled, the glass-plate transport line height can be raised by means of the suction pad during the transporting movement to thereby attain prevention of such as a collision or contact with others. Thus, as a next position for delivery of the glass plate approaches, the glass plate is gradually lowered, and when the next glass-plate delivery position has been reached, the suction pad can be positioned accurately to a minimum heightwise position required for the delivery of the glass plate.

During the transporting movement of the glass plate, the raising and lowering of the suction pad can be used rationally.

In addition, in accordance with the present invention, there is provided a glass-plate working method in a method of transporting a glass plate in which reciprocating movement is effected between a processing position and another processing position for processing a glass plate, a suction pad is lowered and raised at the one processing position to suck and lift the glass plate, advance movement to the other processing position is effected, the suction pad is lowered at the other processing position to deliver the glass plate, and the suction pad is raised in a non-carrying state, returns in the non-carrying state, and is set on standby, at the one processing position, the suction pad is set on standby at a height of a necessary minimum distance above a glass-plate supporting portion, at a start of transport the suction pad is lowered through the minimum distance, sucks the glass plate, and is raised again through the necessary minimum distance to lift the glass plate, whereupon movement of an advance stroke toward the other processing position is started, and the suction pad is further raised during the movement of this advance stroke and keep moving while raising the lifting height of the glass plate. As a next processing position approaches, the suction pad is lowered, whereupon as a position above the glass-plate supporting portion at the next processing position has been reached, the heightwise position of the suction pad and the lifted glass plate is positioned at a position of the height of a necessary minimum distance from an upper surface of the glass-plate supporting portion, at which processing position the suction pad is lowered through the minimum distance of height, releases and delivers the glass plate to the glass-plate supporting portion, whereupon the suction pad is raised again to the height of the necessary minimum distance in the non-carrying state, and a return stroke is simultaneously started in the non-carrying state, the non-carrying suction pad being gradually raised at the start of the return stroke, the suction pad being gradually lowered and as an original processing position approaches, whereupon when the suction pad returns to the position above the glass-plate supporting portion at the original processing point, the suction pad is positioned at the position of the height of a necessary minimum position from the upper surface of the glass-plate supporting portion, at which heightwise position the operation is set on standby until the start of transport of an ensuing glass plate.

According to the above-described glass-plate working method in accordance with the present invention, at each of the processing positions, the suction pad is set on standby at a heightwise position of a slight and necessary minimum distance from the upper surface of the glass-plate supporting portion, and the reception of the glass plate is effected by the lowering and raising by that necessary minimum distance. For this reason, it is possible to shorten the time period in the reception and lifting of the glass plate, the time period from this lifting until the start of transport to a next position, and the time period from the lowering of the suction pad until completion of the suction and raising of the glass plate. Further, the time period until the start of transport of the received glass plate can also be shortened.

In addition, the glass plate which has been raised to a line at the height raised during transport is lowered again as a next processing position approaches during its transporting movement, and when that next processing position has been reached, the glass plate is positioned above the glass-plate supporting portion (placing portion for glass-plate delivery) again at the heightwise position of the necessary minimum distance. Next, the suction pad is lowered through this minimum distance, delivers the glass plate, and is raised again through the necessary minimum distance, whereupon return to the original processing position is started. At the same time, processing movement (processing operation) is started at the processing position.

For this reason, as this processing position as well, it is possible to shorten the time periods from the lowering of the suction pad until the releasing and delivery onto the glass-plate supporting portion and the raising of the suction pad and from the reception of the glass plate until the start of processing operation.

Accordingly, the worked glass-plate transporting time is reduced, and the takt time of the processing operation at the processing position is speeded up. Therefore, the manufacturing speed of worked glass plates is substantially enhanced.

Advantages of the Invention

According to the present invention, it is possible to provide a glass-plate working method and a glass-plate working apparatus which make it possible to speed up the transport of the glass plate from one processing position to another and shorten takt time in the processing operation, thereby further increasing the production of worked glass plates.

MODE FOR CARRYING OUT THE INVENTION

Figure 1:
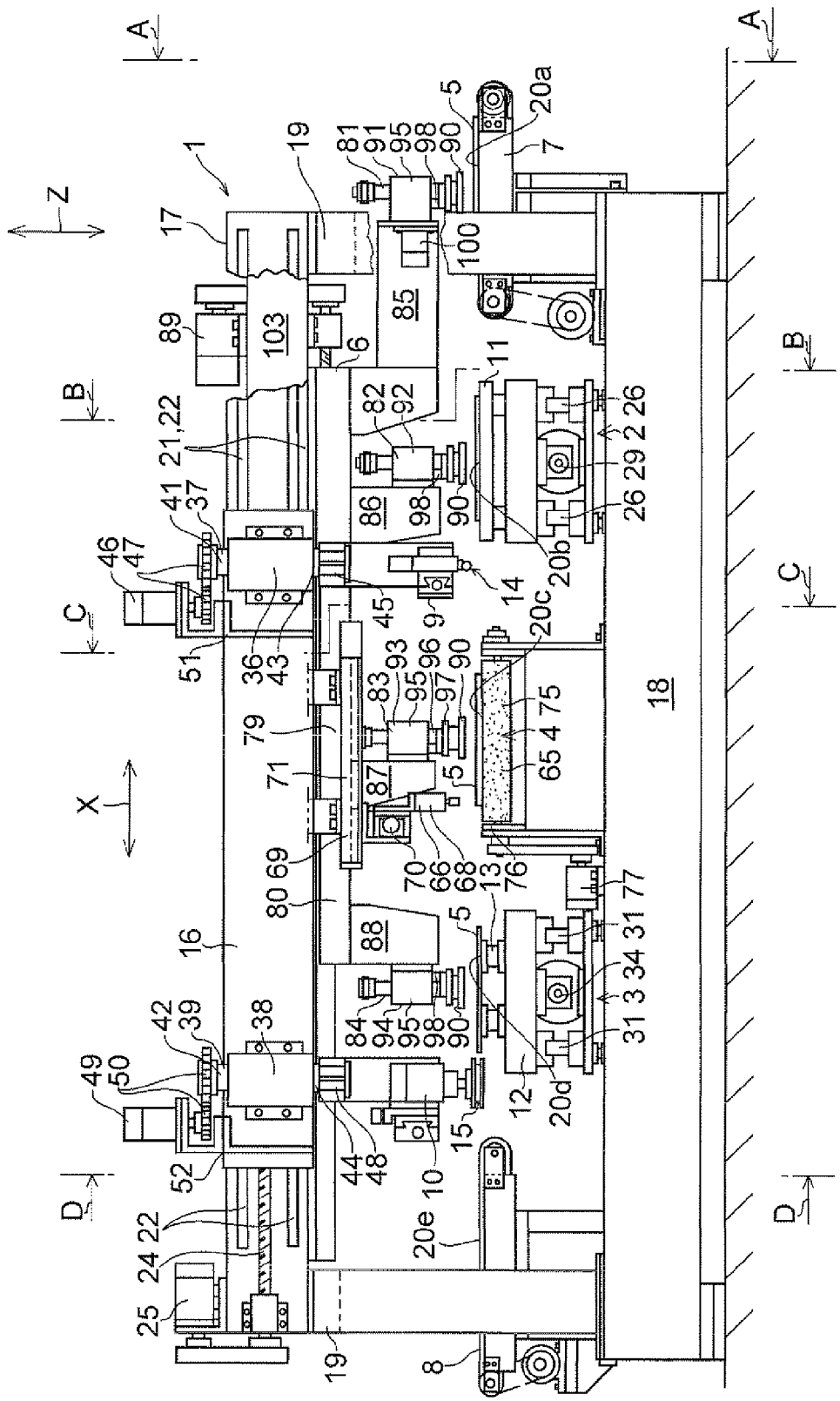
FIG. 1 is a front elevational view of an embodiment of the present invention.
Figure 2:
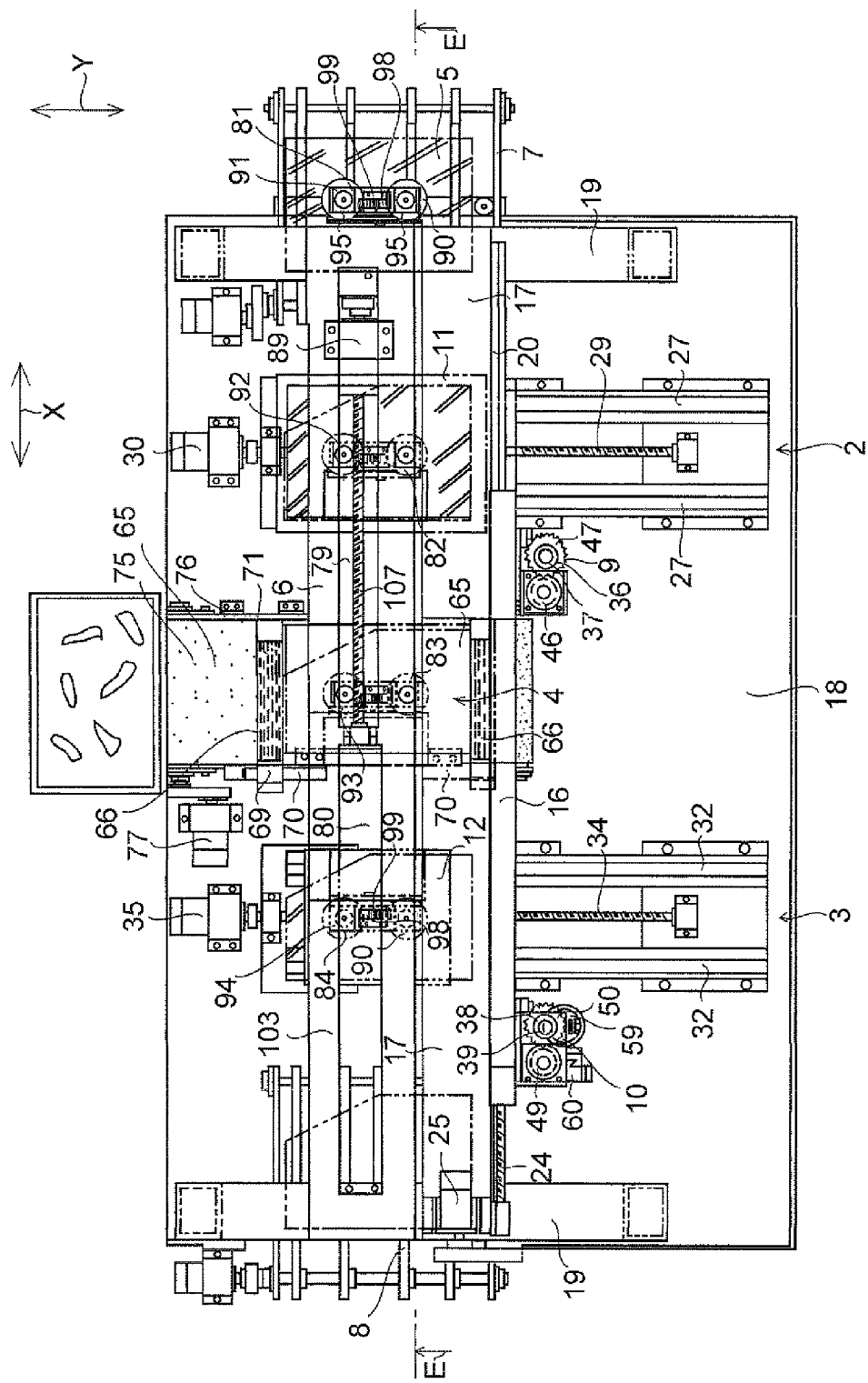
FIG. 2 is a plan view of the embodiment shown in FIG. 1.
Figure 3:
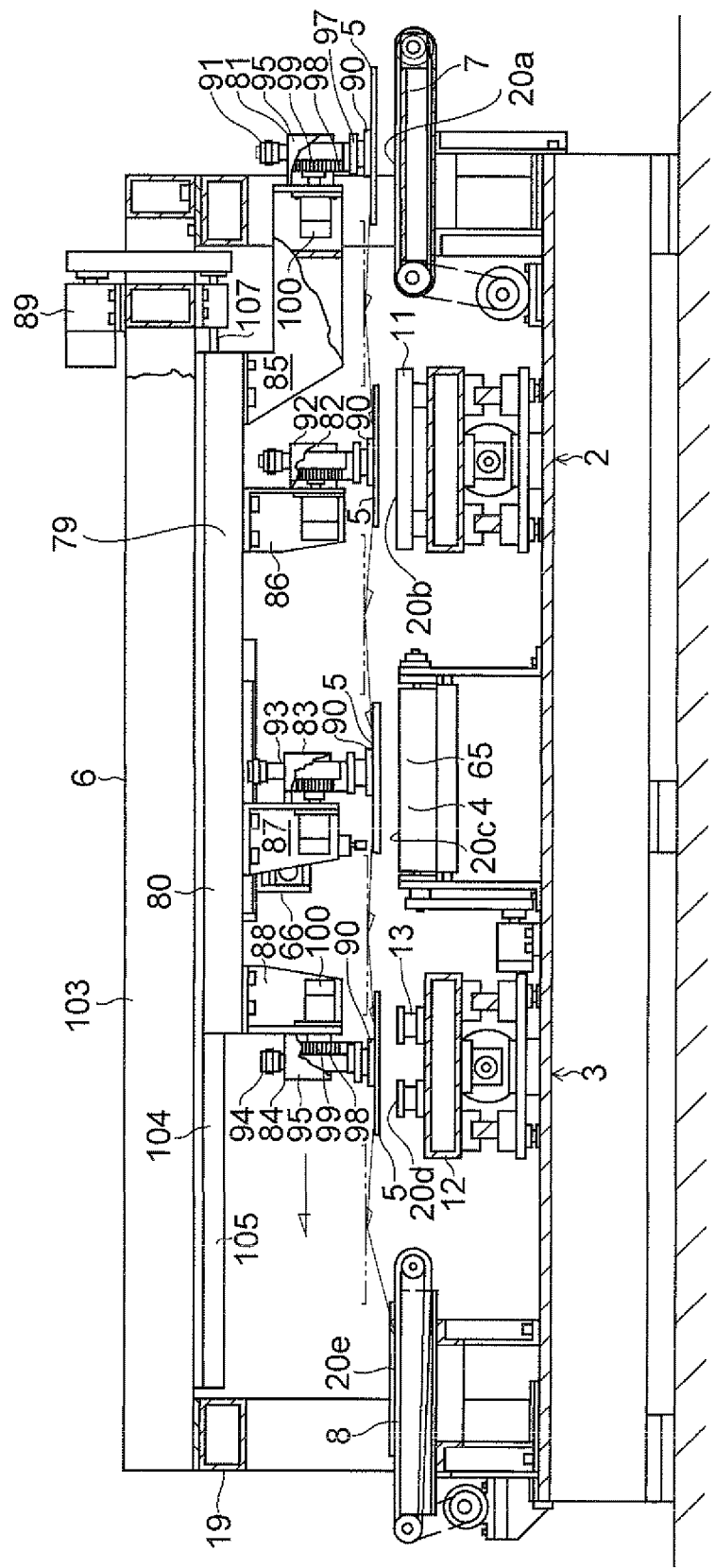
FIG. 3 is a cross-sectional view taken along line E-E shown in FIG. 2.

Next, referring to the drawings, a description will be given of a specific example of the present invention. It should be noted that the present invention is not limited to such an example.

As shown in FIGS. 1 to 9, in a glass-plate working apparatus 1 in accordance with this embodiment, a cutting section 2 for forming a cut line on a glass plate is disposed on the right side; a grinding section 3 for grinding a peripheral edge of the glass plate is disposed on the left side; a bend-breaking section 4 is disposed in the center; and a glass-plate transporting section 6 for transporting the glass plate 5 is disposed in the rear.

Further, a feed conveyor 7 for the glass plate is disposed on a carrying-in side of the cutting section 2, and a discharge conveyor 8 is disposed on a carrying-out side of the grinding section 3.

The cutting section 2 has a cutting head 9 provided with a cutter wheel 14 as well as a cutting table 11 for supporting the glass plate 5. In addition, the grinding section 3 has a grinding head 10 provided with a grinding wheel 15 as well as a grinding table 12 for holding the glass plate 5. It should be noted that it is a plurality of suction cups 13 disposed on this grinding table 12 that directly hold the glass plate 5 on the grinding table 12.

The aforementioned cutting head 9 and cutting table 11 are subjected to NC control so as to undergo contour-controlled movement in an orthogonal plane coordinate system, and the aforementioned grinding head 10 and the grinding table 12 are also subjected to NC control so as to undergo contour-controlled movement in the orthogonal plane coordinate system. In addition, the contour-controlled movement in the cutting section 2 and the contour-controlled movement in the grinding section 3 are identically performed simultaneously in parallel.

The cutting head 9 of the cutting section 2 and the grinding head 10 of the grinding section 3 are mounted on a common moving base 16, and this moving base 16 effects linear motion (hereafter referred to as the movement) in an X-axis direction.

Accordingly, the cutting head 9 and hence the cutter wheel 14, as well as the grinding head 10 and hence the grinding wheel 15, share an X axis, and integrally effect the movement in the X-axis direction.

Meanwhile, the cutting table 11 which moves in a Y-axis direction in correspondence with the cutting head 9 and the grinding table 12 which moves in the Y-axis direction in correspondence with the grinding head 10 are respectively mounted independently, but are both controlled in synchronism with each other.

A first mount 17 is installed forwardly and upwardly of the cutting table 11 and the grinding table 12. The first mount 17 is installed on a pair of gate-shaped frame bases 19 erected at front and rear ends of a machine base 18.

Two sets of slide rail devices 21 are provided in parallel on a front face of this first mount 17 along the X-axis direction. Each of these slide rail devices 21 consists of a rail body 22 installed on the first mount 17 and a plurality of slide blocks 23 which move on this rail body 22, and the moving base 16 is fixed to these slide blocks 23.

The aforementioned cutting head 9 and grinding head 10 are mounted on this moving base 16.

Accordingly, the cutting head 9 and the grinding head 10 are integrally moved (linearly moved) in the X-axis direction together with the moving base 16 by the aforementioned slide rail devices 21.

The driving of the moving base 16 in the X-axis direction is effected by a feed screw 24 provided between the two sets of slide rail bodies 22 and by an X-axis control motor 25 for driving this feed screw 24. Installed below the respective ones of the aforementioned cutting head 9 and grinding head 10 are the cutting table 11 in correspondence with the cutting head 9 and the grinding table 12 in correspondence with the grinding head 10.

In addition, the cutting table 11 and the grinding table 12 are moved by being mutually synchronously controlled. The upper surface of the cutting table 11 is formed so as to flatly support the glass plate 5.

The plurality of suction cups 13 are disposed on the upper surface of the grinding table 12, and the glass plate 5 is fixed onto these suction cups 13 by suction while maintaining its flatness.

The aforementioned cutting table 11 is mounted on a pair of slide rail devices 26 which are disposed along the Y-axis direction.

Each of these slide rail devices 26 has a rail body 27 and a pair of slide blocks 28 assembled to this rail body 27, and the aforementioned cutting table 11 is fixed on top of these slide blocks 28.

The movement in the Y-axis direction of the cutting table 11 is effected by a feed screw 29 provided along the rail bodies 27 and by a Y-axis control motor 30 connected to the feed screw 29.

In addition, the grinding table 12 is mounted on a pair of slide rail devices 31 which are similarly disposed along the Y-axis direction. Of course, each of these slide rail devices 31 also has a rail body 32 and a pair of slide blocks 33 assembled to this rail body 32, and the grinding table 12 is fixed on top of these slide blocks 33.

The movement in the Y-axis direction of the grinding table 12 is effected by a feed screw 34 disposed along the rail bodies 32 and by a Y-axis control motor 35 connected to this feed screw 34.

The Y-axis control motor 30 and the Y-axis control motor 35 which are respectively disposed independently are synchronously operated by a numerical controller so that the cutting table 11 and the grinding table 12 are synchronously moved in the Y-axis direction. On the front face of the moving base 16 which moves in the X-axis direction, a bearing unit 36 is mounted in correspondence with the aforementioned cutting table 11, and a bearing unit 38 is mounted in correspondence with the grinding table 12.

The bearing unit 36 has a rotating shaft 37 which is held by bearings (not shown).

The bearing unit 38 has a rotating shaft 39 which is held by bearings.

The aforementioned rotating shafts 37 and 39 are assembled such that their rotational axes are in a state of being perpendicular to the X-Y plane coordinate system, i.e., the upper surface of the glass plate 5.

The rotating shafts 37 and 39 rotate about an axis 40 which is perpendicular to the upper surface of the glass plate 5.

As for the rotating shafts 37 and 39, their upper end portions 41 and 42 and lower end portions 43 and 44 are respectively exposed upwardly and downwardly from the respective bearing units 36 and 38.

The cutting head 9 is mounted on the lower end portion 43 of the rotating shaft 37 in the cutting section 2 by means of a bracket 45. Further, an angle control motor 46 is coupled to the upper end portion 41 of this rotating shaft 37 by means of two spur gears 47.

On the other hand, the grinding head 10 is mounted on the lower end portion 44 of the rotating shaft 39 by means of a bracket 48.

Similarly, an angle control motor 49 is coupled to the upper end portion 42 of this rotating shaft 39 by means of two spur gears 50. Of course, the aforementioned angle control motors 46 and 49 are respectively held by brackets 51 and 52 erected from the front face of the moving base 16, and naturally move in the X-axis direction integrally with the moving base 16.

In addition, the cutting head 9 mounted at the lower end portion 43 of the rotating shaft 37 and the grinding head 10 mounted at the lower end portion 44 of the rotating shaft 39 are also respectively mounted at their lower end portions 43 and 44 by means of the brackets 45 and 48 to which the respective rotating shafts 37 and 39 are attached in a laterally gripped state.

Accordingly, the rotating shafts 37 and 39 cause the cutting head 9 and the grinding head 10 to undergo angle-controlled rotation about the axis 40 perpendicular to the surface of the glass plate 5 by being subjected to the angle-controlled rotation by the respective angle control motors 46 and 49.

The cutting head 9 includes a cutter head body 53 having the cutter wheel 14, a position adjusting means 54 for holding this cutter head body 53 and adjusting the position of this cutter head body 53 in two orthogonal directions (X-direction and Y-direction) within a plane parallel to the surface of the glass plate 5, and an air cylinder unit 55 which is mounted at an upper portion of the cutter head body 53, vertically moves the cutter wheel 14 in a Z-axis direction, and imparts cutting pressure to the cutter wheel 14 at the time of forming a cut line on the glass plate 5.

The position adjusting means 54 consists of a Y-direction slide 56 for holding the aforementioned cutter head body 53, an X-direction slide 57 for holding this Y-direction slide 56 movably in the Y direction, and a bracket 58 for holding this X-direction slide 57 movably in the X-direction. Further, an upper portion of the bracket 58 is suspendedly mounted on the bracket 45 to which the lower end portion of the aforementioned rotating shaft 37 is attached in a gripped state.

Figure 8:
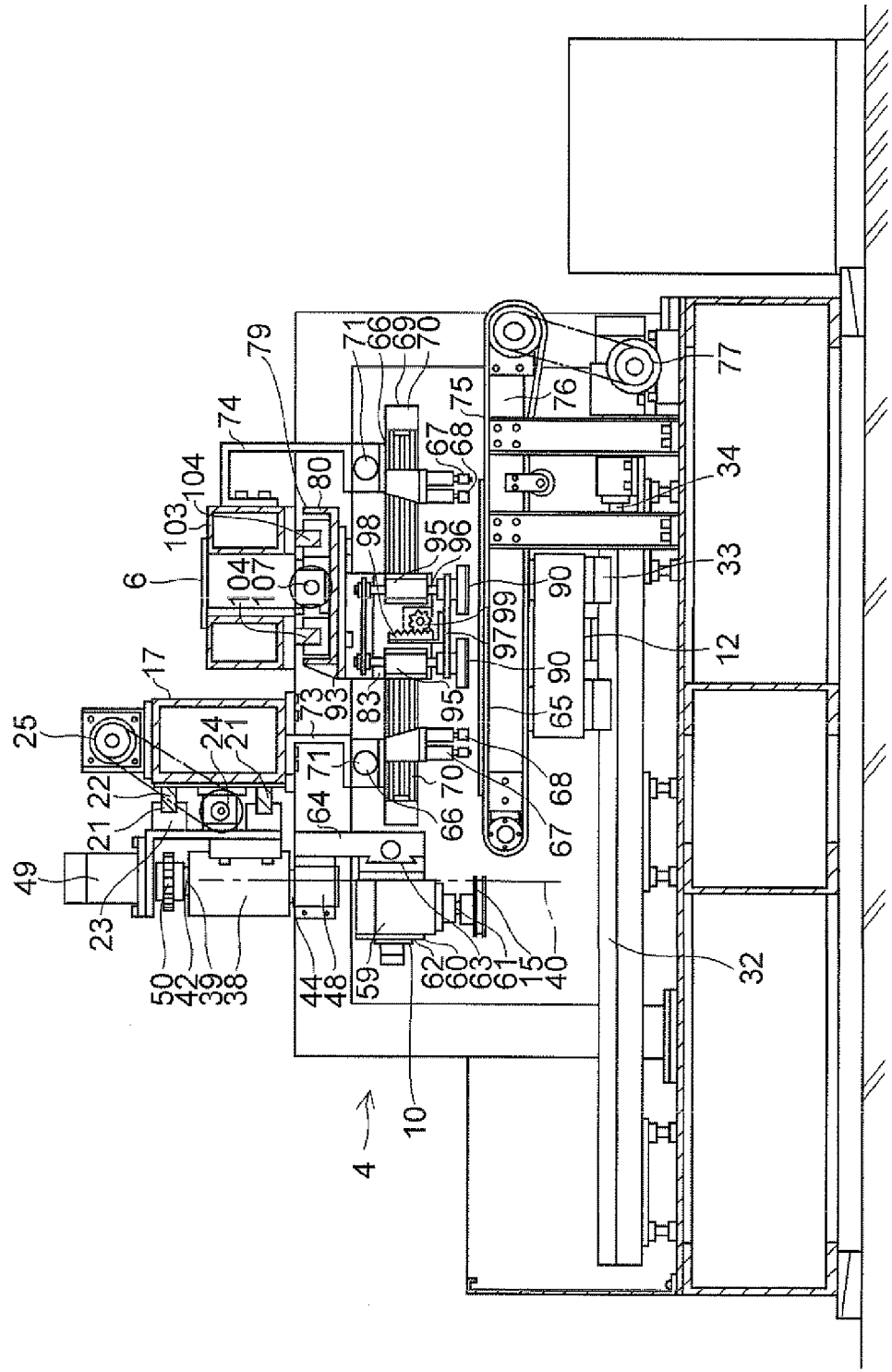
FIG. 8 is a cross-sectional view taken along line D-D shown in FIG. 1.
Figure 9:
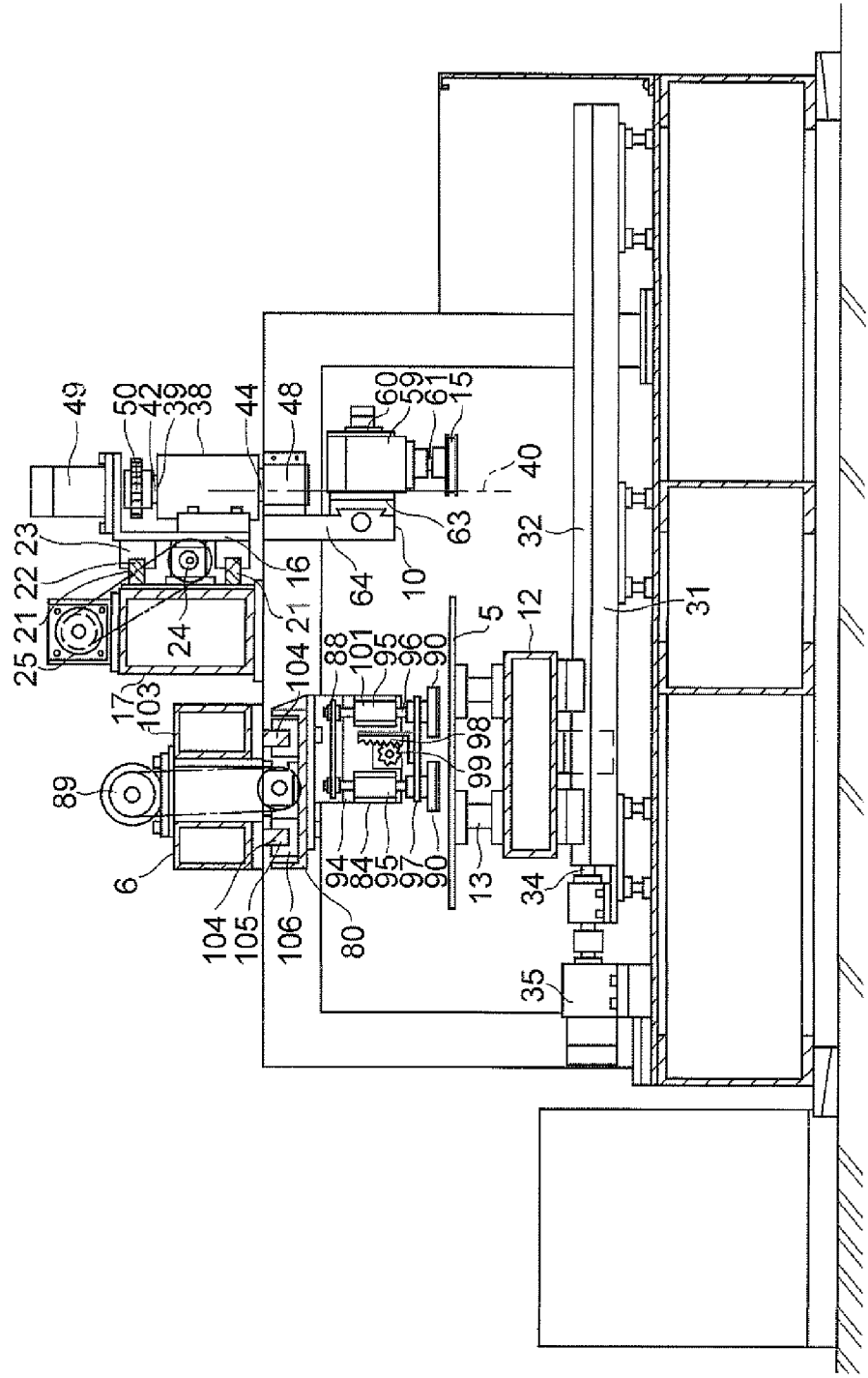
FIG. 9 is a fragmentary plan view of portions shown in FIG. 2.
Figure 10:
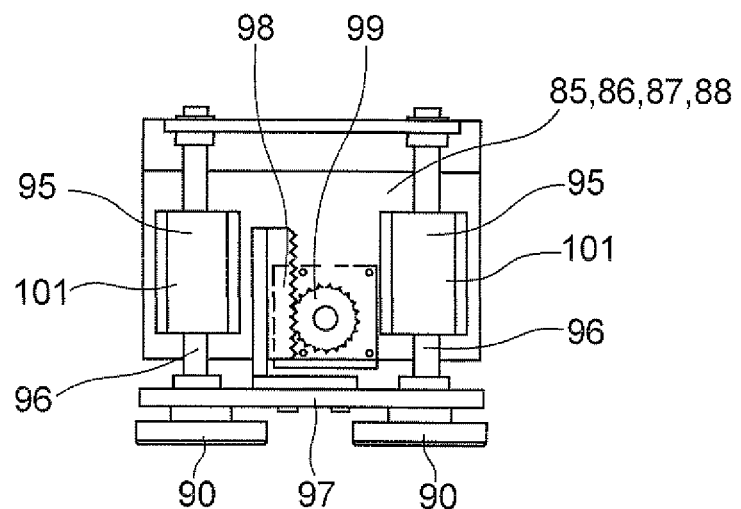
FIG. 10 is a front elevational view of a lifting device of a transporting device.
Figure 11:
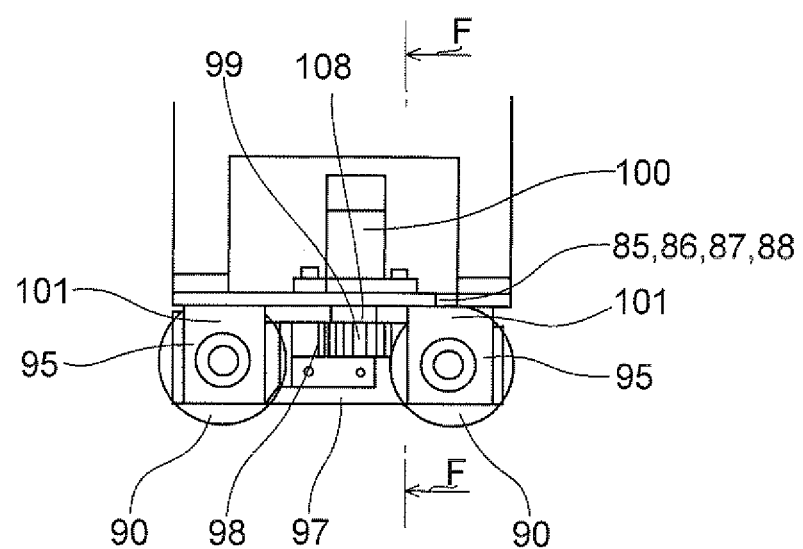
FIG. 11 is a plan view of the lifting device of the transporting device.
Figure 12:
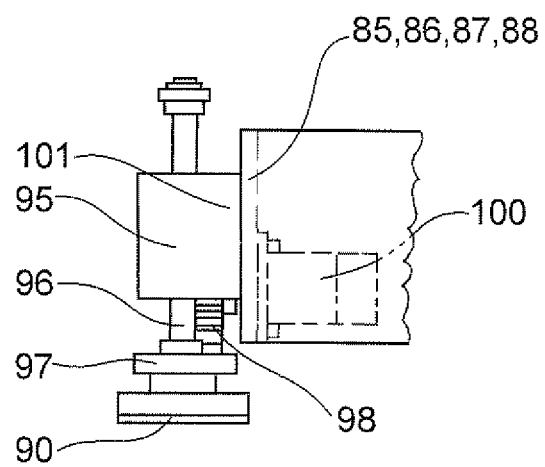
FIG. 12 is a side elevational view of the lifting device of the transporting device.
Figure 13:
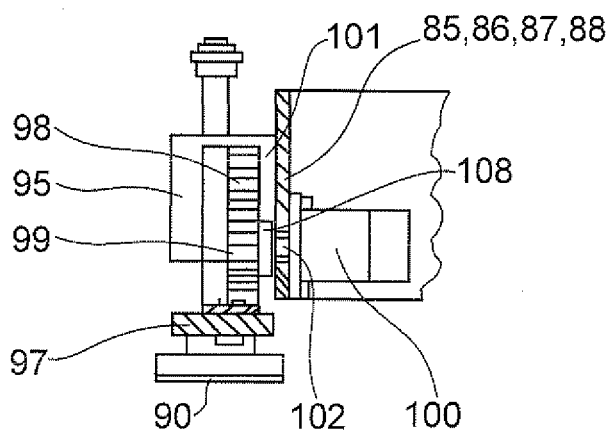
FIG. 13 is a cross-sectional view, taken along line F-F, of the lifting device shown in FIG. 10.
Figure 14:
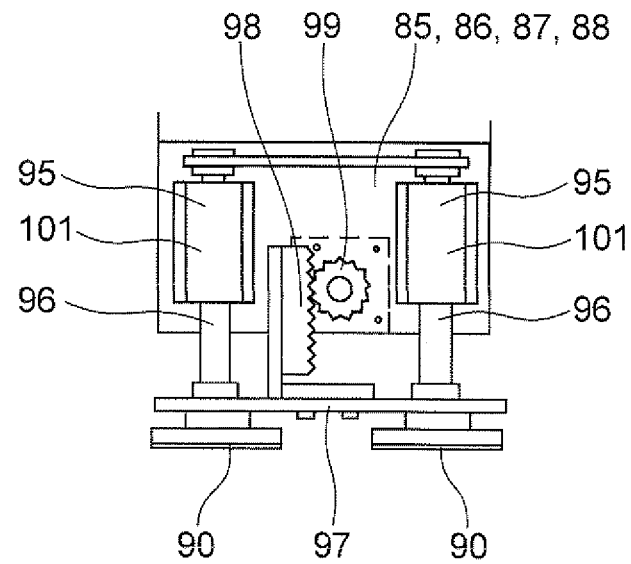
FIG. 14 is a front elevational view of the lifting device in a state in which suction pads have been lowered.
Figure 15:
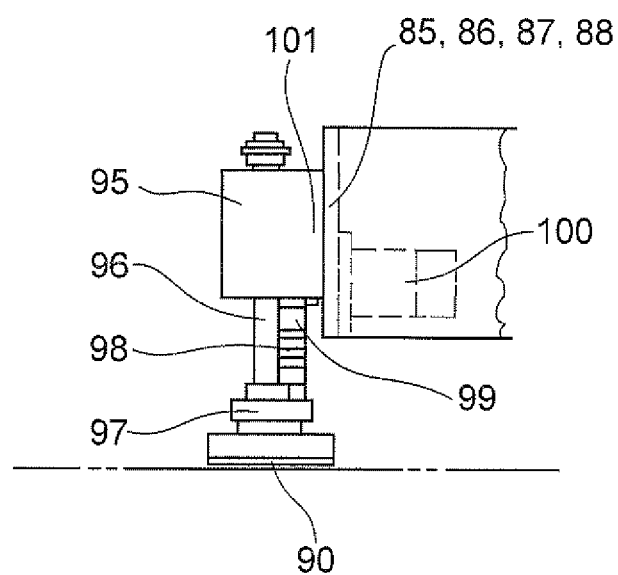
FIG. 15 is a side elevational view of the lifting device in the similar state in which the suction pads have been lowered.

As shown in FIGS. 8 and 9, the grinding head 10 includes a spindle motor 59 and a position adjusting means 60 for adjusting the position of this spindle motor 59 in two orthogonal directions (X-direction and Y-direction), respectively, within a plane parallel to the surface of the glass plate 5. Further, the grinding wheel 15 is mounted on a rotating shaft 61 of the spindle motor 59.

The position adjusting means 60 consists of a Y-direction slide 62 for holding the aforementioned spindle motor 59 and a bracket 64 for holding this Y-direction slide 62 movably in the Y-direction. An upper portion of this bracket 64 is suspendedly mounted on the bracket 48 to which the lower end portion 44 of the rotating shaft 39 is attached in a gripped state.

The grinding wheel 15 is so arranged that its peripheral end face (grinding face) coincides with the axis 40 of the rotating shaft 39 by the adjustment of the aforementioned position adjusting means 60.

As shown in FIGS. 1, 2, 5, and 8, the bend-breaking section 4 includes a horizontal belt conveyor 65 on which is placed the transported glass plate 5 with the cut line formed thereon, as well as two bend-breaking devices 66 for bend-breaking the glass plate 5 placed on this belt conveyor 65.

Each of the bend-breaking devices 66 consists of an end cutter unit 67, a press unit 68, and a moving means 69 for moving the end cutter unit 67 and the press unit 68 over the glass plate 5 along the surface of the glass plate 5. The moving means 69 includes a Y-direction moving unit 70 for holding the end cutter unit 67 and the press unit 68 and for moving under numerical control the end cutter unit 67 and the press unit 68 in the Y direction, as well as an X-direction moving unit 71 for moving numerically this Y-axis moving unit 70 in the X direction. This X-direction moving unit 71 is mounted on the first mount 17 and a second mount 103 by means of brackets 73 and 74.

The belt conveyor 65 includes a conveyor belt 75, a supporting plate/frame 76 for supporting the conveyor belt 75 from inside in the form of a flat surface, and a drive unit 77 for causing the conveyor belt 75 to rotate, and is supported by the machine base 18 by means of brackets in the supporting plate/frame 76.

In terms of the operation of the bend-breaking section 4, first, the glass plate 5 with the cut line formed thereon in the cutting section 2 is transferred to above and placed on the conveyor belt 75 by the lifting of the glass plate 5 by a glass-plate lifting unit 82 corresponding to the cutting section 2 and by the transport of the glass plate by the movement of a moving base 80. Then, a pair of suction pads 90, which returned to this bend-breaking section 4, are lowered and press the glass plate 5 to thereby set the glass plate 5 in a fixed state.

Then, the end cutter unit 67 of each bend-breaking device 66 is sequentially moved to necessary positions to cut end cutting lines on the glass plate 5. Next, the press unit 68 is sequentially moved to necessary positions to effect pressing, thereby bend-breaking and separating unrequired portions.

The glass plate 5 whose unrequired portions have been bend-broken and separated is sucked and lifted up by the suction pads 90 of the glass-plate lifting unit, and is set on standby in this state and awaits its conveyance to the next grinding section 3.

At this time, the belt conveyor 65 is operated to discharge bend-broken cullet on the conveyor belt 75 to the outside.

The glass-plate transporting section 6 has a transporting device 79. This transporting device 79 transports the glass plate 5 on the feed conveyor 7 onto the cutting table 11, the glass plate 5 on the cutting table 11 onto the belt conveyor 65 of the bend-breaking section 4, the glass plate 5 bend-broken by the bend-breaking section 4 and being lifted up by the suction pads onto the suction cups 13 of the grinding table 12, and the glass plate 5 on the suction cups 13 of the grinding table 12 onto the discharge conveyor 8.

The glass plate 5 is sent sequentially from one stage to another by the repetition of the reciprocating movement.

It should be noted that the glass plate 5 is placed on a glass-plate supporting portion 20a on the feed conveyor 7, on a glass-plate supporting portion 20b on the cutting table 11, on a glass-plate supporting portion 20c on the belt conveyor 65 of the bend-breaking section 4, on glass-plate supporting portions 20d on the suction cups 13 of the grinding table 12, and on a glass-plate supporting portion 20e on the discharge conveyor 8. In the cutting section 2 and the grinding section 3, the glass plate 5 is fixedly supported or held during the processing operation at the aforementioned glass-plate supporting portions 20b and 20d. The transporting device 79 has the moving base 80. This moving base 80 is provided in a penetrating manner above the feed conveyor 7, above the cutting table 11, above the belt conveyor 65 of the bend-breaking section 4, and above the suction cups 13 of the grinding table 12, and repeats the reciprocating movement in parallel with the X-axis direction. The moving base 80 also reaches above the discharge conveyor owing to this reciprocating movement. The moving base 80 has glass-plate lifting devices 81, 82, 83, and 84 at positions corresponding to the processing positions. Namely, the moving base 80 has the respective glass-plate lifting devices 81, 82, 83, and 84 at positions corresponding to the glass-plate supporting portion 20a on the feed conveyor 7, the glass-plate supporting portion 20b on the cutting table 11, the glass-plate supporting portion 20c on the belt conveyor 65 of the bend-breaking section 4, and the glass-plate supporting portions 20d on the suction cups 13 of the grinding table 12.

These glass-plate lifting devices 81, 82, 83, and 84 are mounted on the lower surface of the aforementioned moving base 8 by means of brackets 85, 86, 87, and 88, respectively.

The moving base 80 and the glass-plate lifting devices 81, 82, 83, and 84 effect reciprocation as an integral unit.

The reciprocating movement of the moving base 80 is effected under numerical control by a below-described transport control motor 89. In addition, the aforementioned glass-plate lifting devices 81, 82, 83, and 84 have the pair of suction pads 90 for effecting the suction and holding in which a surface of the glass plate is brought into contact with the pad 90, and release of the glass plate 5 and lifting units 91, 92, 93, and 94 for raising and lowering the suction pads 90, respectively.

Each of the lifting units 91, 92, 93, and 94 has a pair of slide units 95 arranged on both sides and adapted to respectively hold the suction pads 90 linearly liftably; a coupler 97 for coupling two slide shafts 96 of the pair of slide units 95 on both sides; a rack 98 erected on an upper surface of this coupler 97; a pinion gear 99 meshing with this rack 98; and a servo motor 100 on which this pinion gear 99 is mounted to drive this pinion gear 99, the pair of suction pads 90 being attached to a lower surface of the coupler 97.

Each of the slide units 95 on both sides consists of a case body 101 and the aforementioned slide shaft 96 which slides inside this case body 101, each of the case bodies 101 being mounted on the aforementioned bracket.

In addition, the pinion gear 99 is attached to a shaft 102 of the servo motor 100, and a servo motor body of the servo motor 100 is mounted on the bracket.

As for the respective lifting units 91, 92, 93, and 94, the pinion gear 99 is rotated by the servo motor 100 to raise or lower the rack 98 meshing with this pinion gear 99, thereby allowing the coupler 97 with this rack 98 mounted thereon and the suction pads 90 attached to this coupler 97 to be raised or lowered.

Incidentally, as for the meshing assembly of the pinion gear 99 and the rack 98, the pinion gear 99 and the rack 98 move relative to each other as the pinion gear 99 is driven. As for the lifting units 91, 92, 93, and 94 in this embodiment, a coupler 108 side coupling the servo motor and the pinion gear is mounted on the moving base 80 (by means of the bracket 85, 86, 87, or 88, of course), the rack 98 side is raised or lowered, and the suction pads 90 are mounted on the rack 98 side which is raised or lowered.

However, although an illustration is not given, an arrangement may be provided such that the rack 98 side is mounted on the moving base 80 in a fixed manner (by means of the bracket, of course), the coupler 108 side coupling the servo motor and the pinion gear is raised or lowered, and the suction pads 90 are mounted on the coupler 108 side coupling the servo motor and the pinion gear.

In addition, the aforementioned moving base 80 is mounted on a pair of slide units 104 installed on the lower surface of the second mount 103 in parallel in the X-axis direction.

The pair of slide units 104 are constituted by a pair of rail bodies 105 laid in parallel and a pair of slide blocks 106 which are respectively assembled to these rail bodies 105, and the aforementioned moving base 80 is attached to these slide blocks 106.

The reciprocating movement of the moving base 80 is driven by a feed screw 107 installed between the pair of rail bodies 105 and by the transport control motor 89 connected to the feed screw 107.

The transport control motor 89 reciprocally moves the moving base 80 under numerical control on the basis of numerical information from the numerical controller.

It should be noted that the aforementioned second mount 103 is laid on the pair of frame bases 19 erected at front and rear ends of the machine base 18 in such a way as to be parallel with the first mount 17 in the rear of the first mount 17.

Figure 4:
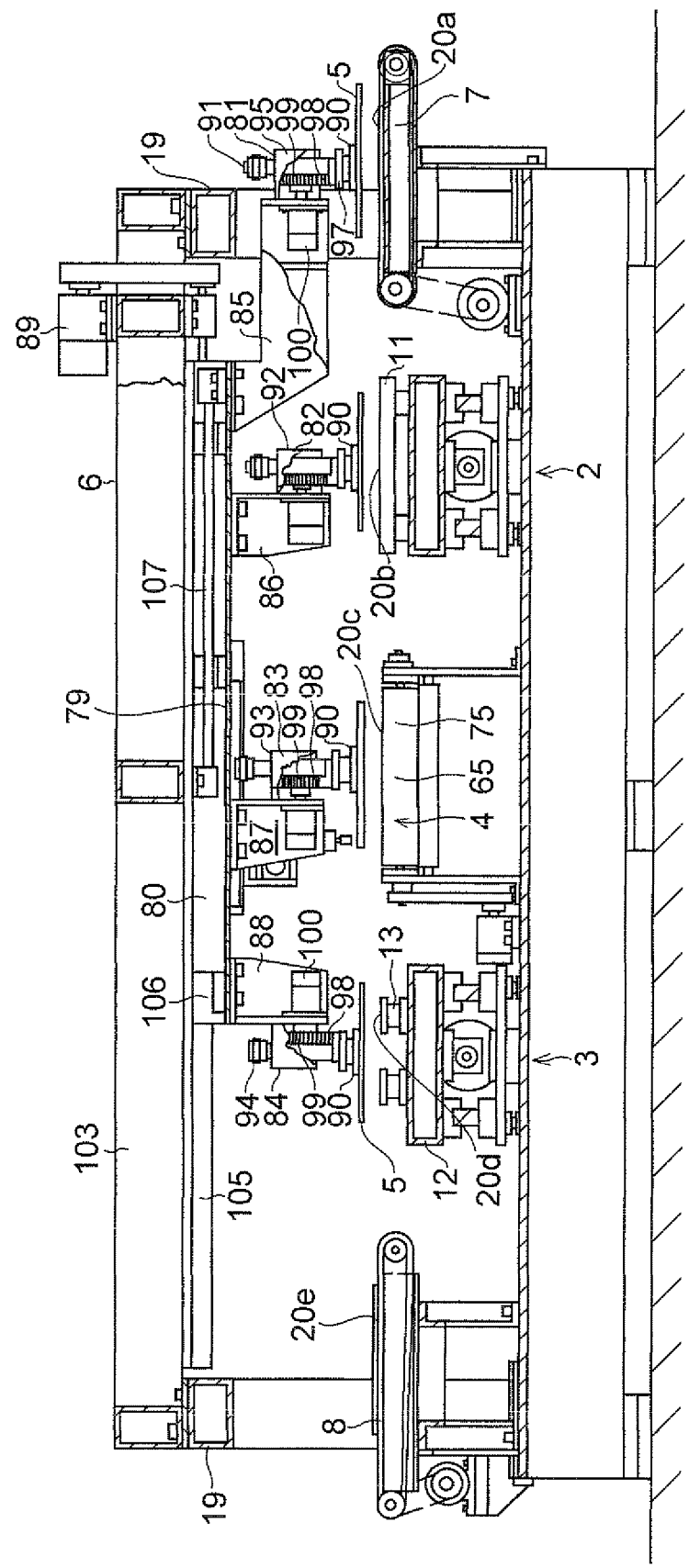
FIG. 4 is a fragmentary cross-sectional view of portions shown in FIG. 3.
Figure 5:
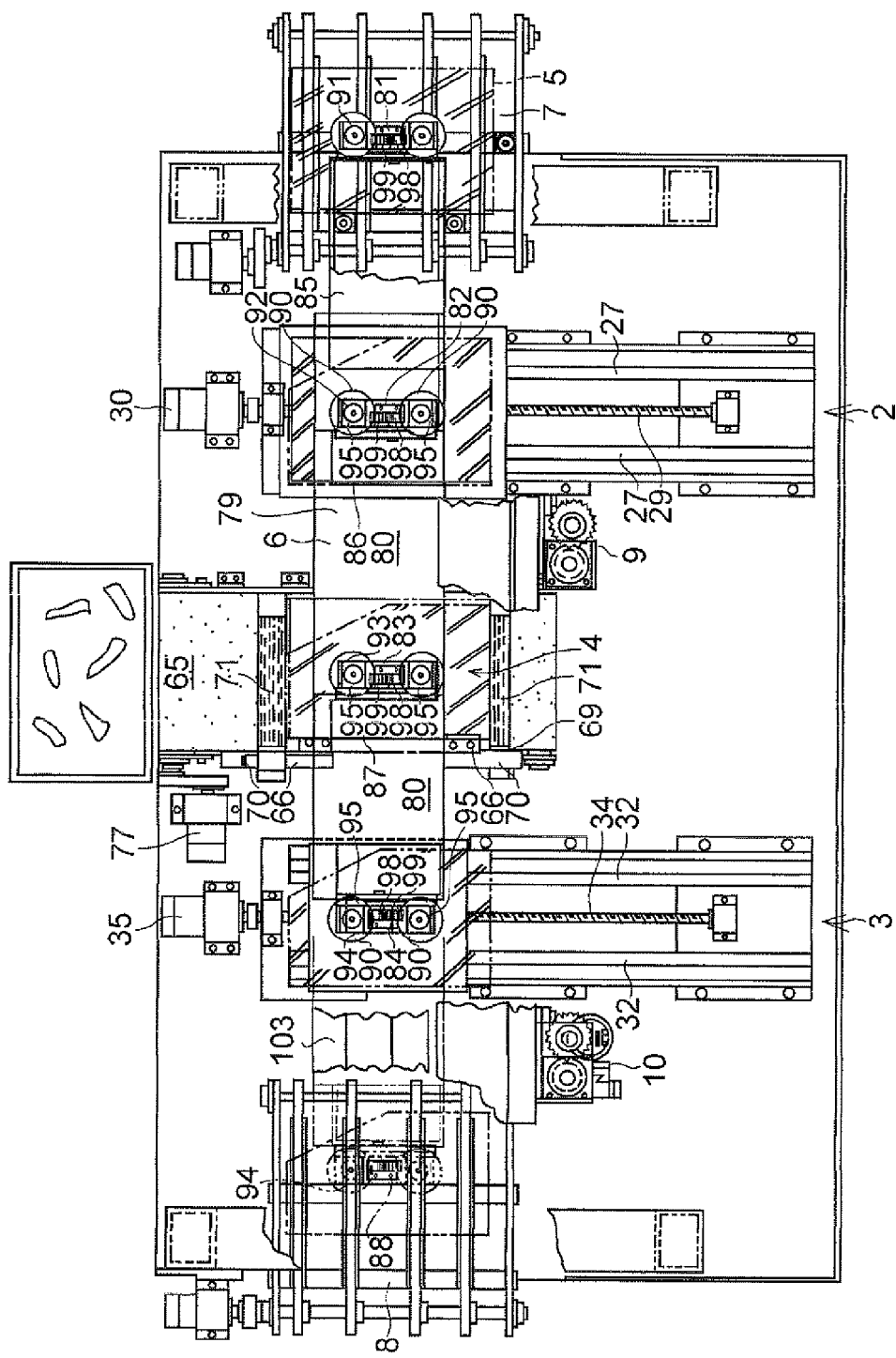
FIG. 5 is a view taken in the direction of arrows along line A-A shown in FIG. 1.
Figure 6:
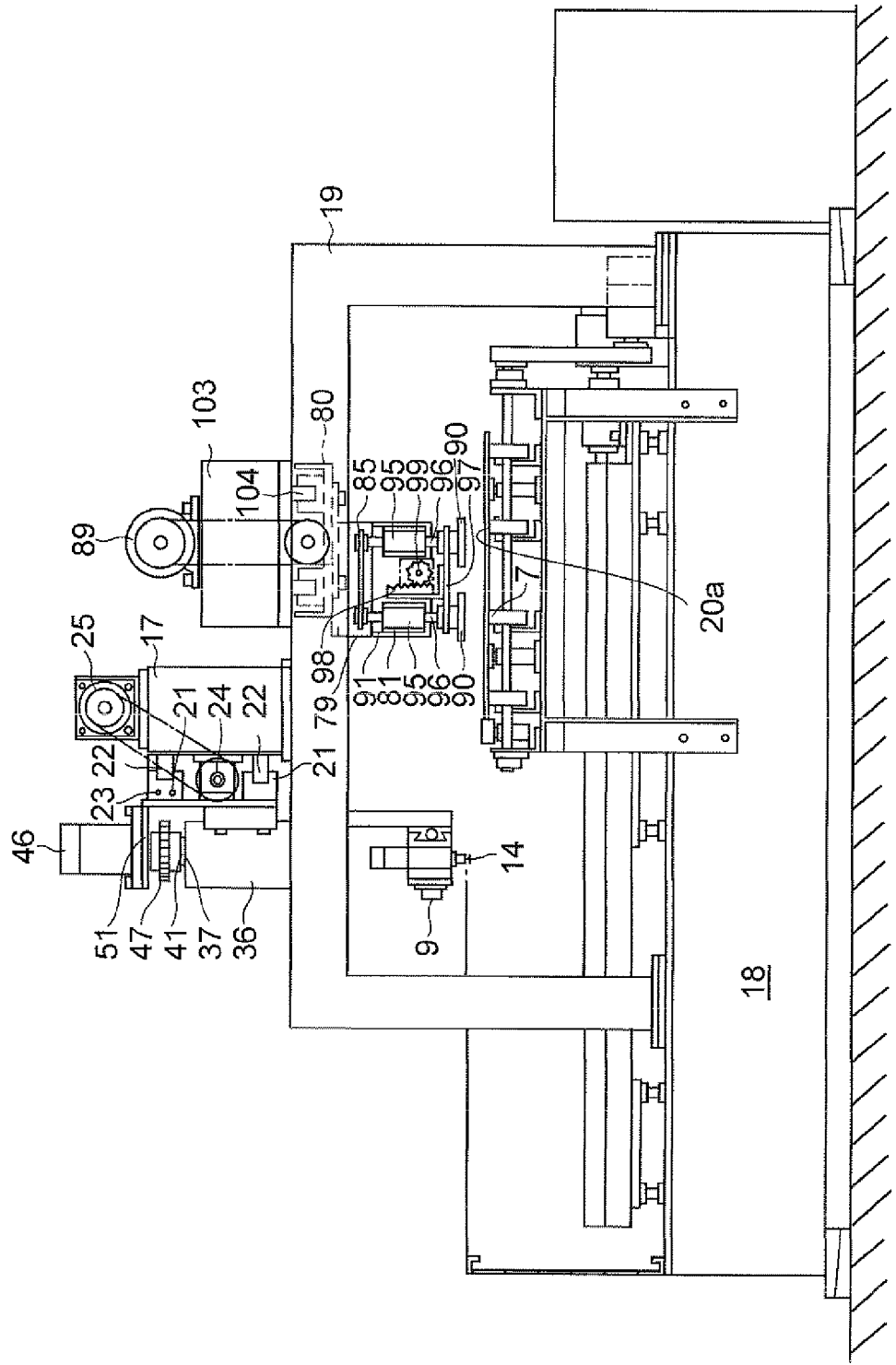
FIG. 6 is a cross-sectional view taken along line B-B shown in FIG. 1.
Figure 7:
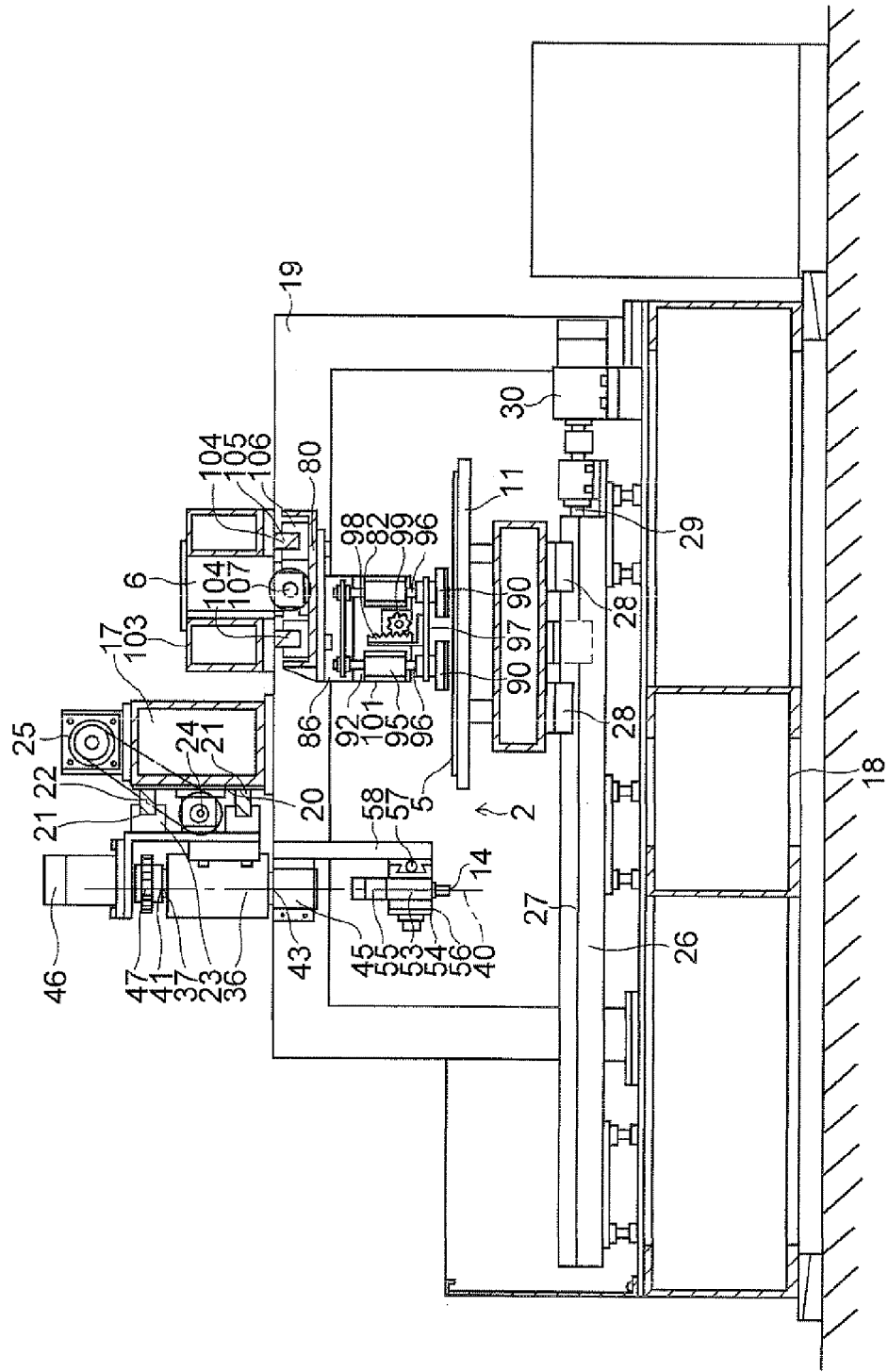
FIG. 7 is a cross-sectional view taken along line C-C shown in FIG. 1.
Figure 16:
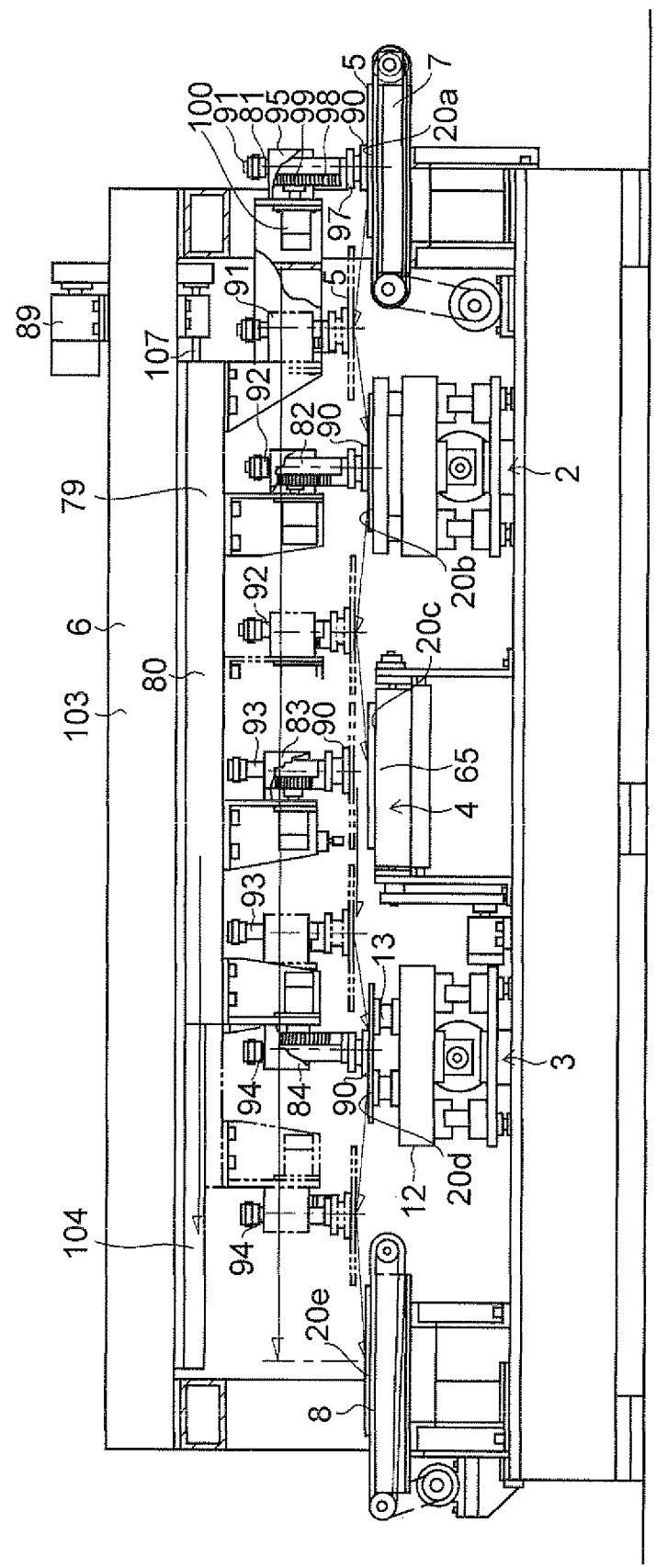
FIG. 16 is a diagram explaining the operation of the transporting device and the lifting device in the embodiment shown in FIG. 1.

In terms of the operation of the glass-plate transporting section 6, as shown in FIGS. 4 and 16, when the glass-plate working apparatus 1 is effecting processing operation at the respective processing positions, the moving base 80 which reciprocates is on standby at a return position. At this juncture, the lifting device 81 is on standby above the feed conveyor 7, the lifting device 82 is on standby above the cutting table 11, and the lifting device 84 is on standby above the grinding table 12, while the lifting units 91, 92, and 94 of the respective lifting devices 81, 82, and 84 are at a standstill at a midway position of lowering, and the respective suction pads 90 are on standby at a heightwise position (about 5 mm or thereabouts) which is at a necessary minimum distance above the upper surface of the glass plate 5 on the supporting base.

It should be noted that, at this juncture, the lifting device 83 corresponding to the belt conveyor 65 of the bend-breaking section 4 is located above the belt conveyor 65, and its suction pads 90 are lowered to a lowermost position and keep pressing the glass plate 5 on the belt conveyor 65. At this time, the pair of bend-breaking devices 66 are operated to bend-break the glass plate 5. Upon completion of bend-breaking, the suction pads 90 suck the glass plate 5, lift it up to an uppermost position, and remain on standby to await integral movement together with the other suction pads 90.

Next, when the processing operation at the respective processing positions is finished, and the cutting table 11 and the grinding table 12 return to their points of origin, the lifting devices 81, 82, and 84, excluding the lifting device 83 located at the bend-breaking section 4, concurrently cause the suction pads 90 to be lowered a minimum distance (a distance of about 5 mm or thereabouts) by means of the lifting units 91, 92 and 94, and then to be brought into contact with the glass plates 5, to suck and lift the glass plates 5 first to the height of the necessary minimum distance (about 5 mm or thereabouts). Simultaneously with the completion of the raising to the height of this minimum distance, the moving base 80 starts its advance stroke, and the transport of the glass plates 5 at the respective processing positions to the next processing positions is started. At the same time, the lifting units 91, 92, and 94 of the lifting devices 81, 82, and 84 advance while gradually raising the height of the glass plates 5 by means of the suction pads 90.

Then, after an intermediate position in the advance stroke has passed, and as the lifting devices 81, 82, and 84 approach the glass-plate supporting portions 20b at the next processing positions, the lifting units 91, 92, and 94 of the lifting devices 81, 82, and 84 conversely lower the glass plates 5 gradually. When the lifting devices 81, 82, and 84 reach above the glass-plate supporting portions 20b at the next processing positions, and the moving base 80 stops, the heightwise position of the glass plates 5 is positioned at a heightwise position (about 5 mm or thereabouts) spaced apart a necessary minimum distance from the upper surfaces of the supporting bases.

Next, the respective suction pads 90 are lowered the remaining minimum distance, cause the glass plates 5 to be brought into contact with the upper surfaces of the glass-plate supporting portions, whereupon the glass plates 5 are released from the suction pads 90 and are transferred onto the glass-plate supporting portions 20b.

Next, the glass-plate lifting devices 81, 82, 83, and 84 cause the suction pads 90 to be raised again the necessary minimum distance (about 5 mm or thereabouts from the upper surfaces of the glass plates 5 transferred just now) by means of the lifting units 91, 92, 93, and 94. Simultaneously with the completion of the raising of the respective suction pads 90 (in a brief time period), the moving base 80 starts its return stroke.

At the same time, the glass-plate working apparatus 1 starts the processing operation at the respective processing positions.

When the moving base 80 enters the return stroke, the respective lifting devices 81, 82, 83, and 84 effects its return movement while gradually raising the height of the suction pads 90.

After an intermediate position in the return stroke has passed, and as the lifting devices 81, 82, 83, and 84 approach their original processing positions, the lifting devices 81, 82, 83, and 84 gradually lower the suction pads 90. When the lifting devices 81, 82, 83, and 84 have reached above the supporting bases at the original processing positions, the heightwise position of the glass plates 5 is positioned again at the heightwise position spaced apart the minimum distance from the upper surfaces of the glass-plate supporting portions, and the respective suction pads 90 remain on standby at this heightwise position.

When the glass-plate supporting portions respectively supporting the glass plates 5, i.e., the cutting table 11 and the grinding table 12, return to their points of origin upon completion of the processing operation at the respective processing positions, the above-described glass-plate transporting section 6 repeats the same operation as described above, and sequentially sends the glass plates 5 to be processed to the respective processing positions. The worked glass plate 5 which is sequentially sent to the final discharge conveyor 8 is discharged as a processing finished article.

DESCRIPTION OF REFERENCE NUMERALS AND SIGNS

1: glass-plate working apparatus
2: cutting section
3: grinding section
4: bend-breaking section
5: glass plate
6: glass-plate transporting section
7: feed conveyor
8: discharge conveyor

The invention claimed is:
1. A glass-plate working apparatus comprising:
a first processing mechanism equipped with a first glass-plate supporting portion for supporting a glass plate; a second processing mechanism equipped with a second glass-plate supporting portion for supporting the glass plate; and a transporting device for transferring the glass plate from said first glass-plate supporting portion to said second glass-plate supporting portion,
said transporting device including a moving base which reciprocates between said first glass-plate supporting portion and said second glass-plate supporting portion, a pair of suction pads mounted on said moving base and suctioning and holding and releasing the glass plate, and a lifting devise mounted on said moving base and raising and lowering said pair of suction pads,
said lifting device having a rack-and-pinion device consisting of a meshing combination of a rack and a pinion gear coupled to a servo motor for raising and lowering said pair of suction pads under numerical control, said lifting device causing said pair of suction pads to undergo raising and lowering movement under numerical control by linear movement of the pair of suction pads produced by the meshing combination of said rack and said pinion gear which rotates by being coupled to said servo motor for raising and lowering, wherein said glass plates are raised up from the first glass-plate supporting portion by means of the pair of suction pads during the transporting movement of the glass plates from the first glass-plate supporting portion to the second glass-plate supporting portion, the raised up glass plates are gradually lowered down toward the second glass-plate supporting portion by means of the pair of suction pads as the raised up glass plates approach the second glass-plate supporting portion from the first glass-plate supporting portion, and said lifting device having a pair of slide units adapted to respectively hold the pair of suction pads linearly liftably; a coupler for coupling each of slide shafts of the pair of slide units; a rack erected on the coupler; a pinion gear meshing with the rack; and a servo motor on which the pinion gear is mounted to drive the pinion gear.

2. The glass-plate working apparatus according to claim 1, wherein the first processing mechanism is that of a glass-plate feed conveyor, and the second processing mechanism is that of a glass-plate cutting section for forming a cut line on a surface of the glass plate.

3. The glass-plate working apparatus according to claim 1, wherein the first processing mechanism is that of a glass-plate cutting section for forming a cut line on a surface of the glass plate, and the second processing mechanism is that of a bend-breaking section for bend-breaking the glass plate in accordance with the cut line formed on the surface of the glass plate.

4. The glass-plate working apparatus according to claim 1, wherein the first processing mechanism is that of a cutting and bend-breaking section for forming a cut line on a surface of the glass plate and bend-breaking the glass plate in accordance with the cut line, and the second processing mechanism is that of a grinding section for grinding a peripheral edge of the glass plate.

5. The glass-plate working apparatus according to claim 1, wherein the first processing mechanism is that of a bend-breaking section for bend-breaking the glass plate in accordance with a cut line formed on a surface of the glass plate, and the second processing mechanism is that of a grinding section for grinding a peripheral edge of the glass plate.

* * * * *